United States Patent [19]
Foster et al.

[11] Patent Number: 5,342,652
[45] Date of Patent: Aug. 30, 1994

[54] METHOD OF NUCLEATING TUNGSTEN ON TITANIUM NITRIDE BY CVD WITHOUT SILANE

[75] Inventors: Robert F. Foster, Weston, Mass.; Damodaran Srinivas, Tempe, Ariz.

[73] Assignee: Materials Research Corporation, Orangeburg, N.Y.

[21] Appl. No.: 898,565

[22] Filed: Jun. 15, 1992

[51] Int. Cl.$^5$ .............................................. C23C 16/00
[52] U.S. Cl. ................................... 427/253; 427/250; 427/255; 427/255.1; 427/255.7; 427/404; 427/419.7
[58] Field of Search ............ 427/250, 253, 255, 255.1, 427/255.7, 464, 419.7

[56] References Cited

U.S. PATENT DOCUMENTS

| | | | |
|---|---|---|---|
| 4,404,235 | 9/1983 | Tarng et al. | 427/89 |
| 4,629,635 | 12/1986 | Brors | 427/255.2 |
| 4,650,696 | 3/1987 | Raby | 427/89 |
| 4,650,698 | 3/1987 | Moriya et al. | 427/237 |
| 4,684,542 | 8/1987 | Jasinski et al. | 437/245 |
| 4,830,891 | 5/1989 | Nishitani et al. | 427/253 |
| 4,851,295 | 7/1989 | Brors | 428/450 |
| 4,874,642 | 10/1989 | Garg et al. | 427/249 |
| 4,892,843 | 1/1990 | Schmitz et al. | 437/192 |

FOREIGN PATENT DOCUMENTS

| | | |
|---|---|---|
| 0371854 | 6/1990 | European Pat. Off. |
| 0411646 | 2/1991 | European Pat. Off. |
| 9311558 | 6/1993 | PCT Int'l Appl. |

OTHER PUBLICATIONS

Applied Physics Letters–vol. 59, No. 24, Dec. 9, 1991, New York pp. 3136–3138, XP265155.
Database WPIL; Section Ch, Week, 8818, Mar. 23, 1988 Derwent Publications Ltd., London, GB; Class M13, AN 88-122243 & JP,A,63 065 075 (Fujitsu Ltd.) see abstract.
Database WPIL; Section Ch, Week 9123, May 10, 1991 Derwent Publications Ltd., London, GB; Class L03, AN 91-169463 (Anonymous) & RD,A,325063 see abstract.

*Primary Examiner*—Bernard Pianalto
*Attorney, Agent, or Firm*—Wood, Herron & Evans

[57] ABSTRACT

Nucleation of a refractory metal such as tungsten is initiated on a substrate of TiN without the use of silane by introducing hydrogen into a CVD reactor before the introduction of the reactant gas containing the metal, brought to reaction temperature and to reaction pressure. The process is most useful for CVD of tungsten onto patterned TiN coated silicon semiconductor wafers. Alternatively, hydrogen is introduced in a mixture with the metal containing gas, such as $WF_6$, and maintained at subreaction pressure, of for example 100 mTorr, until the substrate is stabilized at a reaction temperature of approximately 400° C. or higher, to cause the dissociation of hydrogen on the wafer surface, then elevated to a relatively high reaction pressure of, for example, 60 Torr at which nucleation is achieved. Also, the reduction reaction that deposits the tungsten film proceeds without the need for a two step nucleation-deposition process.

20 Claims, 2 Drawing Sheets

NUCLEATION OF TUNGSTEN ON TiN-
PROCESS WINDOW
HYDROGEN REDUCTION OF WF6

NUCLEATION STUDIES-COMPARISON

TUNGSTEN ON VARIOUS SUBSTRATES-INCUBATION TIMES

METHOD OF NUCLEATING TUNGSTEN ON TITANIUM NITRIDE BY CVD WITHOUT SILANE

The present invention relates to the nucleation of tungsten in chemical vapor deposition processes, and more particularly, to processes for the nucleation of tungsten without the use of silane onto titanium nitride films on semiconductor wafers.

BACKGROUND OF THE INVENTION

In the manufacture of silicon integrated circuits, there is a need to perform a process on semiconductor wafers that will plug vias, form interconnections and make contacts on patterned wafers. The dimensions of the holes or trenches that must be plugged or filled with conductive, usually elemental metallic, material is typically in the submicron regime, or $<10^{-6}$ meter. Because of the narrow dimensions and steep stepped sides of these vias and contact holes, physical deposition processes such as sputtering are often unsatisfactory and ineffective.

One convenient and effective process for filling these vias and contact holes with conductive material and for forming contacts has been found to be the chemical vapor deposition (CVD) of elemental tungsten (W). This process, which usually involves a reduction reaction of tungsten hexafluoride vapor ($WF_6$), results in adequate film conformality in vias and contact holes.

$WF_6$ can be directly reduced by a substrate itself to cause the tungsten to coat the substrate with a film. This can occur when the substrate reacts with the $WF_6$, reducing it directly, or where the substrate yields monatomic hydrogen. It has been found, however, that with a substrate such as one of silicon, a limited deposition thickness of tungsten is achieved because the reaction slows substantially as the initial film coats the wafer. When this occurs, further deposition can be achieved only with the availability of another reducing agent, such as $H_2$ or $SiH_4$.

The typical CVD tungsten reaction involves use of hydrogen gas ($H_2$) as a reducing agent for the $WF_6$ gas. The $WF_6$ and $H_2$ gases are usually premixed in an inlet region of a cold wall reactor and then directed onto the surface of a wafer to be coated, which is maintained at an elevated reaction temperature of, for example, 450° C. When the mixed gases contact the wafer at this temperature, the $WF_6$ and $H_2$ react producing elemental tungsten (W) which is deposited onto the wafer as a film, and a hydrogen fluoride (HF) byproduct gas that is carried away from the wafer surface by the gas flow within the processing chamber.

However, it has been found that the compatibility of tungsten to materials such as silicon and dielectrics is very poor. Tungsten has been found to initially react with the silicon (Si) of the wafer, producing first a thin film of tungsten silicide (WSi) and creating pits in the underlying silicon layer, resulting in possible defects. The elemental tungsten, however, thereafter adheres to the WSi film.

Adhesion of tungsten to dielectric materials has also been found to be poor. To circumvent the problems of poor adhesion or initial nucleation of the tungsten to the dielectrics and the consumption of silicon from the wafer surface by a W-Si reaction, silane ($SiH_4$) has been used, at least in the initial phase of the process, for reduction of the $WF_6$. As a result, any WSi formed along with the tungsten film is supplied from a reaction of $WF_6$ with $SiH_4$, and therefore utilizes silicon from the silane rather than from the wafer. Onto this WSi film the W layer is then deposited.

Silane, however, is a hazardous substance and its presence in the manufacturing facility, where permitted by laws and regulations, is undesirable. The substance is toxic, flammable, explosive, and expensive to handle and maintain safely. The use of $SiH_4$ in W CVD causes silicon to be incorporated into the tungsten films resulting in an increased resistivity of the deposited tungsten film. $SiH_4$ also reacts with $WF_6$ at low temperatures, often as low as 15° C., and thus causing deposition of tungsten in undesired locations within the reactor, requiring frequent cleaning of the reactor and thus increasing the reactor down-time and reduced throughput.

Alternatively, adhesion promoting layers have been applied to silicon and dielectrics prior to the tungsten deposition. One such layer is titanium nitride (TiN). Reactively sputtered TiN, CVD TiN and RTP formed TiN have been found to be effective adhesion layers for tungsten deposition on dielectric materials. Nonetheless, unacceptably long incubation times, sometimes in the range of several minutes, have been reported to result before tungsten starts to deposit onto TiN layers when $H_2$ is used as a reducing agent. With the use of $SiH_4$ for reduction of the $WF_6$, the nucleation of W onto TiN films is enhanced and is often almost instantaneous.

TiN itself reduces a $WF_6$ gas to form a fluoride compound which is not volatile at temperatures below approximately 580° C. Since $WF_6$ reduction reactions are typically performed at approximately 450° C., the fluoride compound, where it results, can poison the wafer surface inhibiting the $H_2$ dissociation on the TiN surface, thereby prolonging the W forming reaction.

Accordingly, there is a need in the manufacture of semiconductor devices, for a more effective method of nucleating tungsten, particularly on TiN films on substrates.

SUMMARY OF THE INVENTION

It is therefore a primary objective of the present invention to provide a process for promoting the nucleation of tungsten onto TiN layers on semiconductor wafers without the use of silane. More particularly, it is an objective of the present invention to provide a process to promote the nucleation of tungsten onto TiN layers on semiconductor wafers using $H_2$ for $WF_6$ reduction.

It is a further objective of the present invention to provide a tungsten nucleation method which will initiate the W deposition reaction without substantial time delay. It is a further objective of the present invention to provide a tungsten nucleation method which will efficiently and effectively initiate a tungsten CVD process without impairing the quality of the tungsten film deposited onto the TiN.

According to the principles of the present invention, $H_2$ is introduced into the reaction chamber of a CVD reactor, preferably prior to the introduction of $WF_6$. In accordance with the invention, $H_2$ is introduced into the reactor and brought into contact with the substrate at an appropriate temperature and an appropriate pressure, preferably in pure form, but alternatively in a mixture with $WF_6$. The temperature and pressure are sufficient to cause the dissociation of $H_2$ and produce free hydrogen on the wafer surface so that, when the reduction reaction starts, the hydrogen is available in sufficient abundance to react with the WF$_6$ to form tungsten. Formation of non-volatile fluorides, such as TiF$_x$ is avoided by exposing the wafer surface to the dissociated hydrogen from the appropriate pressure, appropriate temperature H$_2$ dissociation before contact with predominantly WF$_6$ gas. If WF$_6$ is introduced with the H$_2$, dissociation is promoted before the reduction reaction takes place by maintaining the pressure below that required for the WF$_6$ reduction reaction, thus avoiding contact of the wafer surface with a low temperature high pressure mixture of H$_2$ and WF$_6$ gas. As a result, nucleation of the tungsten occurs on the TiN surface and deposition of the tungsten proceeds in a single process step, rather than requiring a nucleation process step followed by the tungsten deposition step.

In the preferred embodiment of the invention, H$_2$ is introduced into the reactor at a pressure of approximately 60 Torr and then the temperature of the H$_2$ and substrate are brought to a process temperature, preferably approximately 450° C. Generally, the use of higher pressures permits the lowering of the temperatures, for example, 90 Torr at 415° C. and 200 Torr at approximately 390° C. The limits may vary from reactor to reactor, particularly where mass and temperature flow characteristics differ. When the temperature and pressure are stabilized, WF$_6$ is introduced and the W deposition begun.

Alternatively, H$_2$ in a mixture with WF$_6$ is introduced into the reactor with the pressure initially at less than reduction reaction pressure, for example below approximately 3 Torr, preferably at approximately 100 mTorr and the temperature brought up to approximately 450° C. The pressure is then increased to approximately 60 Torr as the temperature is stabilized. The deposition is then begun.

The process of the invention brings H$_2$ to the surface of the substrate in a condition for dissociation at or before the time that WF$_6$ is available and in condition for reduction. As one consequence, non-volatile fluorides do not form with material from the substrate to retard the adhesion of the tungsten to the substrate.

The process is preferably performed at pressures above 1 Torr and at temperatures in the range of 400° to 650° C., which are typical conditions used for tungsten CVD.

The invention provides the advantages of elimination of silane from the CVD process, improvement of the throughput of tungsten CVD processes, particularly in processes for the blanket W deposition, and making the tungsten CVD process more economical.

The present invention improves tungsten CVD onto reactively sputtered TiN, CVD TiN, RTP formed TiN and other similar substrates, particularly those which form non-volatile substances such as fluorides that will inhibit W deposition on the substrate surface or which do not reduce WF$_6$ readily. The process is effective on such substrates as CVD TiN, reactively sputtered TiN, and RTP formed TiN as well as with silicon, sputtered TiW, and Ti on silicon nitride.

With the present invention, nucleation is achieved, onto TiN layers for example, with the use of H$_2$ only as a WF$_6$ reducing agent, in about ten seconds, without damage to the substrate due to excessive exposure to the reducing gas. The tungsten nucleation and subsequent deposition of tungsten are achieved in a single step as opposed to the two-step processes that use separate nucleation and deposition steps.

In addition, the tungsten nucleation process of the present invention is advantageous when used with sequences in which TiN is deposited in a first process then removed from a vacuum for transfer to a second processor, during which transfer the TiN coated wafers are exposed to oxygen containing atmosphere, and then subjected to the tungsten coating process in which the nucleation process of the present invention is used. The process of the present invention is also effective when both the TiN process and the W coating process are performed consecutively without breaking the vacuum as in a multichamber cluster tool.

The above described and other objectives and advantages of the present invention will be more readily apparent from the following detailed description of the drawings in which:

DETAILED DESCRIPTION OF THE DRAWINGS

The tungsten nucleation method of the present invention can be performed in any of a number of CVD reactors which those skilled in the art would select for the application of tungsten films on semiconductor wafers using a WF$_6$ reduction process, including cold wall CVD reactors, hot wall CVD reactors and rotating disk CVD reactors. A rotating disk reactor in which the present invention has been particularly successful is disclosed in the commonly assigned and copending U.S. Patent application entitled ROTATING SUSCEPTOR SEMICONDUCTOR WAFER PROCESSING CLUSTER TOOL MODULE USEFUL FOR TUNGSTEN CVD, invented by Foster et al., filed on even date herewith and expressly incorporated herein by reference. Another fixed susceptor cold wall reactor in which the present invention has been particularly successful is illustrated diagrammatically in FIG. 1, and described below.

Figure 1:
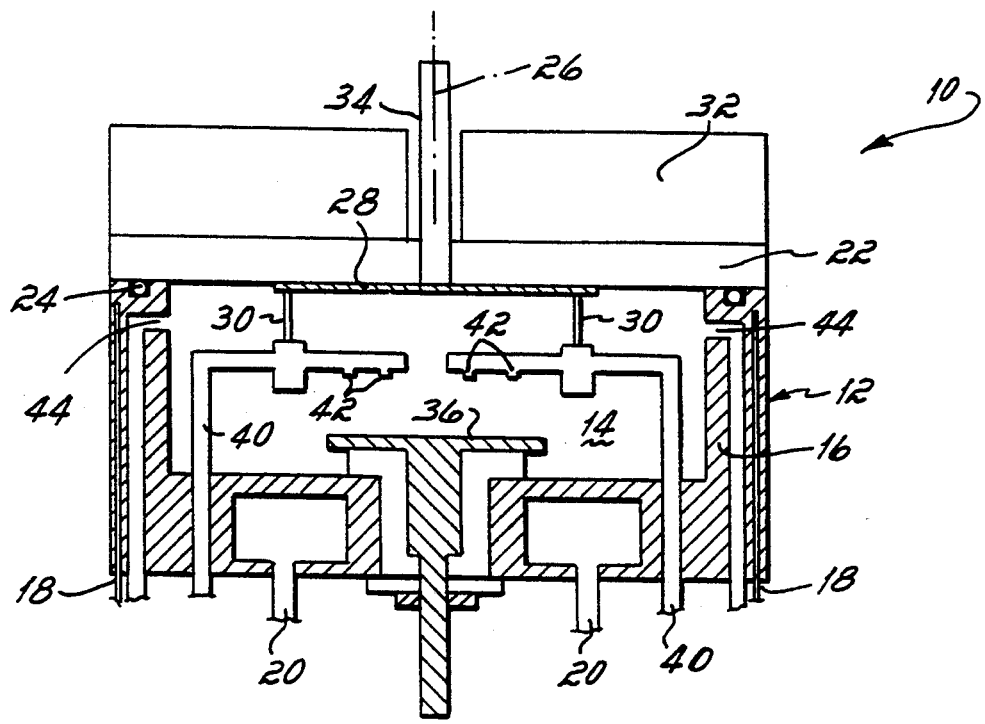
FIG. 1 is a diagram illustrating a CVD reactor in which the method of the present invention can be performed.

Referring to FIG. 1, a cold wall CVD reactor 10 is illustrated. The reactor 10 includes a reaction vessel 12 in which is defined a reaction chamber 14 contained within a metallic reactor wall 16 maintained at a subreaction temperature by cooling water circulation ports 18 and 20 within the reactor wall 16. The method of the present invention relates to a process for CVD of tungsten without the use of silane (SiH$_4$), and therefore, the subreaction temperature at which the walls are maintained may be typical room temperature of, for example, 20° C.

The chamber 14 within the reactor vessel 12 has a top sealed by a quartz window 22 that forms the chamber upper wall. The window 22 is sealed to the upper rim of the wall 16 with a seal, illustrated as an O-ring 24, effective to allow the chamber 14 to be pumped to a vacuum of, for example, $10^{-5}$ Torr and purged. The reactor 10 and the reactor components are generally aligned on a vertical axis 26 on which a semiconductor wafer 28 is held against the downwardly facing side of the window 22 by ceramic pins 30, for example four in number, for processing. Behind, that is above, the window 22, are positioned the quartz lamps of a radiant heater 32 that is operated to heat the wafer 28 to an elevated reaction temperature for CVD processing. The temperature of the wafer 28 is monitored for temperature control by a thermocouple 34 which extends through the window 22 into thermal contact with the backside of the wafer 28.

In the bottom of the wall 16 of the vessel 12 at the center thereof is an RF electrode 36 that may be used for plasma CVD processing within the chamber 14 or for chamber cleaning. Above the electrode 36, a plurality of gas injection tubes 40 are positioned, each with a plurality of downwardly facing orifices 42. Out of the orifices 42, process gas is injected into the chamber 14. The orifices 42 in the tubes are positioned and distributed to provide a generally uniform flow of gases across the surface of the wafer 28 during processing, flowing first downwardly toward the electrode 36 and then rising toward and flowing radially outward along the surface of the wafer 28 to a ring of exhaust ports 44 around the side of the wall 16.

Preparatory to a CVD process in the reactor 10, a wafer 28, is inserted into the chamber 14 and held against the window 22 by pins 30 with the surface thereof that is to be processed facing downwardly into the chamber 14. This surface is preferably coated with a TiN film onto which a tungsten layer is to be deposited in the chamber 14. The chamber 14 is then pumped down and purged of the initial gas and any preheating or degassing of the wafer prior to deposition of a film is performed.

In the preferred embodiment of the process of the present invention, hydrogen gas ($H_2$) is first injected through the inlet tubes 40 and allowed to flow against the surface of the wafer 28 so that an ample supply of dissociatable $H_2$ is available to react with the $WF_6$ gas and combine with the fluorine thereof prior to commencement of the CVD reaction. The pressure in the chamber during this $H_2$ injection is preferably approximately 60 Torr. Then, the temperature of the wafer 28 is brought up to a reaction temperature of, for example, 450° C. by operation of the lamps of the heater 32. The $WF_6$ is at this time, brought to the pump (not shown) for injection into the chamber 14 through the tubes 40, and the temperature of the wafer 28 and the flowing $H_2$ gas in contact with the wafer 28 is allowed to stabilize at the controlled 450° C temperature. This brings the wafer not only to a temperature sufficient for the dissociation of the $H_2$, but to conditions for promotion of the $WF_6$ reduction reaction once the $WF_6$ is introduced.

Then, the $WF_6$ gas is injected into the chamber 14 through the tubes 40, along with a continuous supply of $H_2$ reducing gas mixed in a predetermined ratio with the $WF_6$, and allowed to flow against the surface of the wafer 28. As a result, nucleation on the surface of the wafer has been found to begin in approximately 10 seconds with good nucleation of the tungsten onto the TiN film. It has been found that effective nucleation of tungsten on TiN films occurs with the nucleation process of this embodiment when the chamber pressure and reaction temperature fall within the process window shown by the shaded area of FIG. 2.

In a second embodiment of the invention, after the wafer 28 is positioned on the window 22 and the chamber 14 is purged, the temperature of the wafer 28 is brought up to approximately 500° C. with the chamber pressure initially at approximately 100 mTorr while a mixture of $H_2$ and $WF_6$ gas is injected into the chamber 14 through the tubes 40 and allowed flow across the surface of the wafer 28. Then, the pressure is increased to 60 Torr as the temperature of the wafer 28 and the gases in contact with the wafer 28 are allowed to stabilize at the reaction temperature, 500° C. The mixture of $H_2$ and $WF_6$ is sufficiently $H_2$ rich to insure that all fluorine gas from the reaction is combined with dissociated hydrogen. The reaction then proceeds with nucleation in approximately 10 seconds followed by W CVD onto the TiN film.

Figure 2:
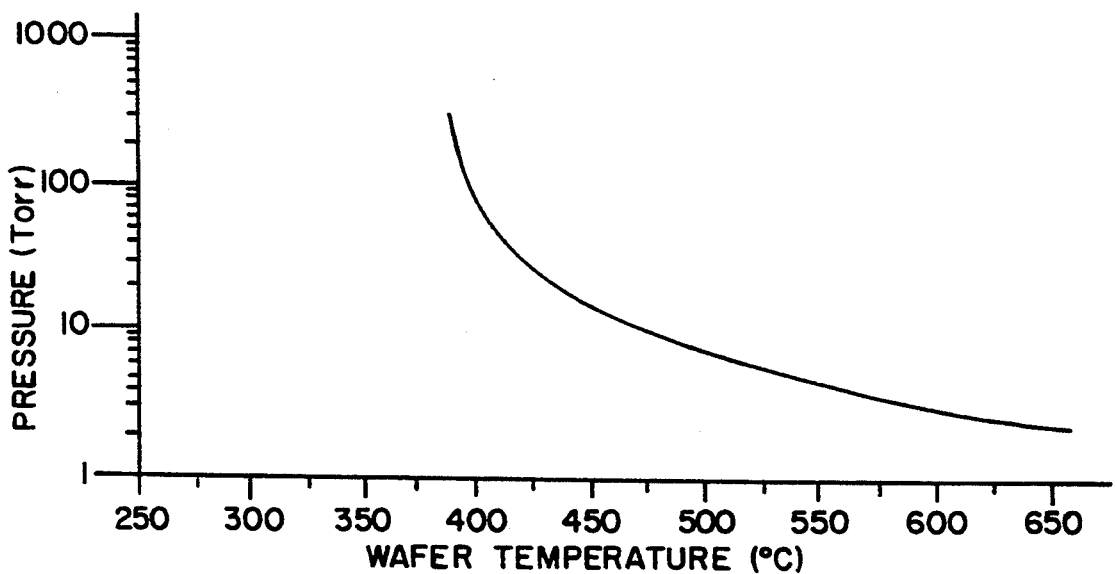
FIG. 2 is a graph illustrating the temperature and pressure process window of one preferred embodiment of the invention.

In the preferred embodiment above, the preferred reaction temperature is in the range of from 400° to 470° C. with pressures preferably higher than the minimum shown in FIG. 2, for example, at the 60 Torr referred to above.

In the injection of the $H_2$ and $WF_6$ gases into the chamber 14, the $WF_6$ gas should not be allowed to enter the chamber 14 prior to the injection of $H_2$, and at high temperatures and pressures, or at any temperature and pressure combination close to the window illustrated in the graph of FIG. 2. Additionally, a mixture of $H_2$ and $WF_6$ gas should not be allowed to enter the chamber 14 to contact the wafer 28 at high or reaction pressure while the temperature is low, that is, where the temperature is outside of the values indicated in the window of FIG. 2. Such conditions will favor the formation of $TiF_x$ compounds adjacent the surface of the wafer that will interfere with the nucleation process.

As an example of poor nucleation results produced by departures from the principles of the present invention, $WF_6$ is first injected into the reaction chamber 14 through the tubes 40 at a pressure of 60 Torr, with the $H_2$ reducing gas advanced to the pump. After the $WF_6$ is allowed to contact the surface of the wafer 28, the temperature of the wafer 28 is brought up to the reaction temperature of, for example, 500° C., where it is stabilized, and the reaction allowed to start. The result produced was poor nucleation, a TiN color change indicating the formation of $TiNF_x$ compounds on the TiN surface, with the edge of the deposited tungsten film peeling when tested by scratch and tape tests.

Similar unsatisfactory results were obtained by first injecting a mixture of $H_2$ and $WF_6$ into the chamber 14 with the pressure at 60 Torr, while the temperature is being brought up to 500° C. With the temperature and pressure stabilized at these levels, the deposition reaction proceeded with also a TiN color change, peeling tungsten film edges, and poor nucleation. The same poor results are achieved where the temperature of the wafer 28 is not raised until after the introduction of the $H_2$ and $WF_6$ mixture is injected at 60 Torr.

Figure 3:
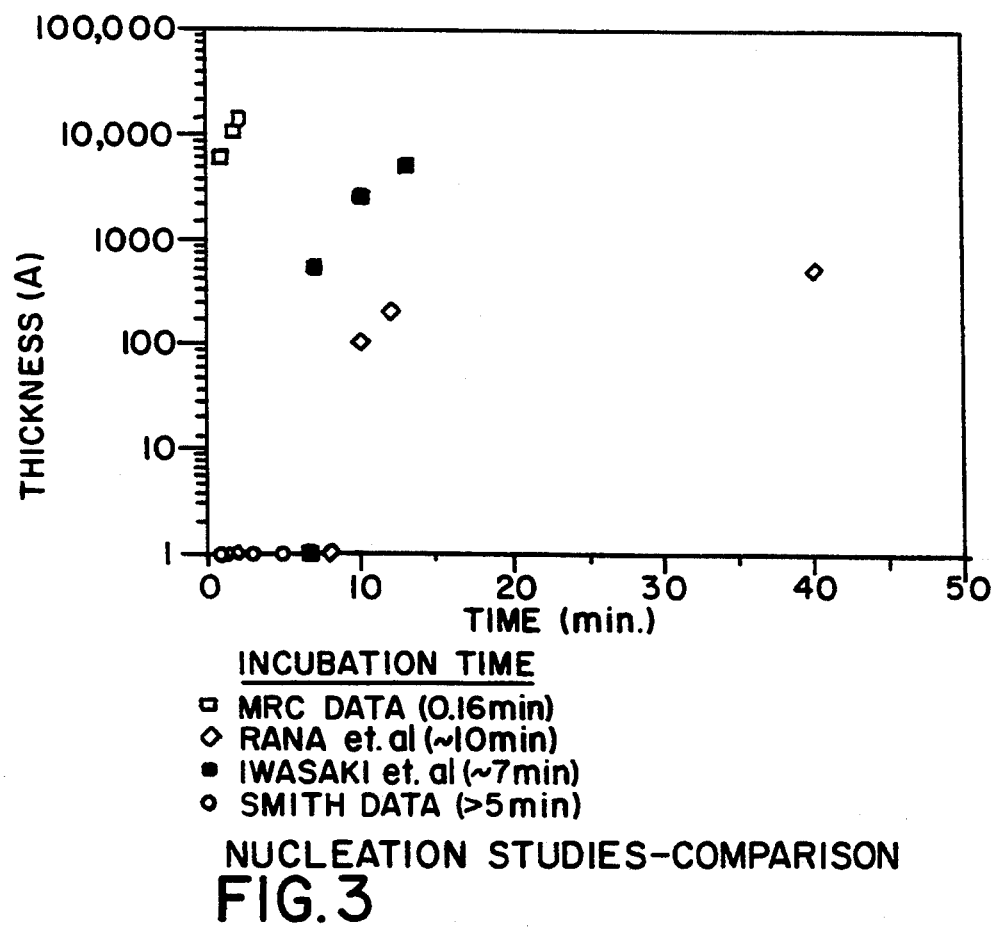
FIG. 3 is a graph comparing the nucleation times produced with the present invention with those of alternative processes.
Figure 4:
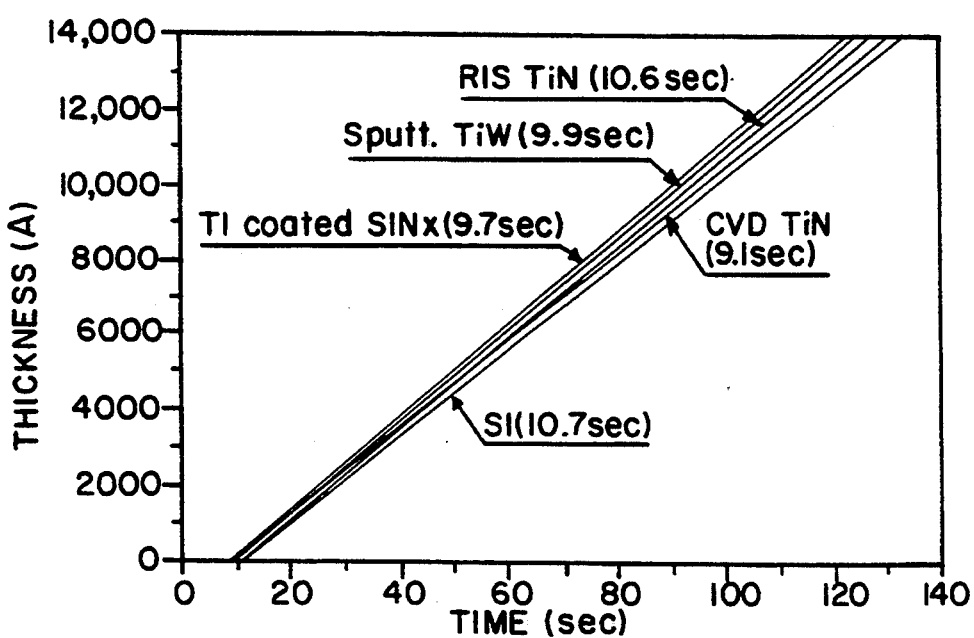
FIG. 4 is a graph comparing the nucleation times produced with the present invention applied to different combinations of coatings and substrates.

With the embodiments of the method of the present invention described above, a comparison of the incubation periods, or the time delay from introduction of the gases to the start of nucleation of tungsten on TiN, is compared with times recorded in literature describing the prior art, as illustrated in FIG. 3. FIG. 4 makes such comparisons of the use of the present invention in the deposition of tungsten on CVD TiN and RIS TiN with tungsten depositions onto substrates on which it has been heretofore known to nucleate: sputtered TiW substrates, silicon substrates and titanium coated $SiN_x$ substrates. The tests of FIG. 3 show an incubation time, with the present invention, of 0.16 minutes, and for the processes described in literature by Rana et al., "Thin Layers of TiN and Al as Glue Layers for Blanket Tungsten Deposition", *Tungsten and Other Refractory Metals for VLSI Applications II*, Materials Research Society, pages 187-195, 1987; Iwasaki et al., "Blanket CVD-W Formed by H$_2$ Reduction of WF$_6$ on TIN for Planar Interconnection", *Tungsten and Other Refractory Metals for VLSI Applications V*, Materials Research Society, pages 187-193, Mat. Res. Soc. Symp. Proc. VLSI V, 1990; and Smith, "CVD Titanium Nitride Nucleation Layer for CVD Tungsten", *Tungsten and Other Refractory Metals for VLSI Applications in* 1990, Materials Research Society, VSLI VI, pages 267-273, Conference Proceedings, 1991; incubation times of approximately 10 minutes, 7 minutes and more than 5 minutes, respectively. The test results of FIG. 4 show incubation times, with the present invention of W onto CVD TiN and 10.6 seconds for W onto RIS TiN, which is comparable to 10.7 seconds for W onto Si, 9.1 seconds for 9.9 seconds for W onto TiW, and 9.7 seconds for Ti onto titanium coated SiN$_x$.

With tungsten films deposited by the embodiments of the present invention described above at 1 micron thickness onto TiN, resistivities in the range of 7 to 9 microohms per centimeter were obtained across the surface of a wafer. SEM cross-sections of 1 micron by 1 micron features produced 100% step coverage as did SEM cross-sections of 1 micron by 6 micron features.

With the methods described above which, unlike with the present invention, injected the WF$_6$ under conditions favoring formation of the non-volatile TiF$_x$ compounds, Auger depth tests reveal poor nucleation resulting, with atomic percentage of less than 25% tungsten and more than 50% titanium in the surface layer.

In contrast, with the method of the present invention, Auger depth profiles of tungsten on TiN reveal that the major portion, over 95%, of the film is made up of tungsten with very few impurities, the atomic percentage of titanium being 1% or less in the surface layer, with the levels of fluorine in the W film and in the TiN layer being insignificant.

In addition, in an embodiment of the present invention, the tungsten nucleation method described above is used in a cluster tool CVD module of the type disclosed in the commonly assigned patent application incorporated by reference above, where TiN film is deposited and then, without breaking the vacuum of the apparatus or exposing the TiN coated wafer to atmosphere, a tungsten coating is applied nucleated by the process of this invention onto the TiN film. In such a process, the wafer is preferably coated with the TiN film in one module of a cluster tool, and then transferred through a transport module while maintaining an inert low pressure atmosphere therein into a second CVD module in which the nucleation process and tungsten deposition process of the present invention described above is performed.

From the above, it will be apparent to one skilled in the art that various alternatives to the embodiments described may be employed without departing from the principles of the invention.

Accordingly, what is claimed is:

1. A method of nucleating tungsten in a tungsten CVD process performed in a vacuum chamber without the use of silane to deposit elemental tungsten onto a substrate, the method comprising the steps of:

injecting hydrogen into the chamber and bringing the chamber to a pressure and temperature sufficient to produce a hydrogen dissociation reaction at the substrate before the introduction of WF$_6$ into the chamber; and then injecting WF$_6$ into the chamber in a ratio with H$_2$ and at a pressure and temperature to produce a reduction reaction resulting in tungsten deposition onto the substrate.

2. The method of claim 1 wherein:
   the hydrogen is injected into the chamber and brought to a pressure and temperature sufficient to produce a WF$_6$ reduction reaction before the introduction of WF$_6$ into the chamber.

3. The method of claim 1 wherein:
   the reaction pressure is above approximately 3 Torr.

4. The method of claim 1 wherein:
   the reaction pressure is above approximately 50 Torr.

5. The method of claim 1 wherein:
   the reaction temperature is above approximately 400° C.

6. The method of claim 1 wherein:
   the substrate has a surface film thereon formed of TiN.

7. A method of nucleating tungsten in a tungsten CVD process performed in a vacuum chamber without the use of silane to deposit elemental tungsten onto a substrate, the method comprising the steps of:

injecting a gas mixture of hydrogen and WF$_6$ into the chamber and maintaining the chamber at a subreaction pressure below that for a WF$_6$ reduction reaction at the temperature of the substrate; and before increasing the pressure from the subreaction pressure, maintaining the temperature of the substrate at least at that for the dissociation of hydrogen; and then increasing the pressure in the chamber to a WF$_6$ reduction reaction pressure.

8. The method of claim 7 wherein:
   the subreaction pressure is below approximately 1 Torr.

9. The method of claim 7 wherein:
   the reaction pressure is above approximately 3 Torr.

10. The method of claim 7 wherein:
    the reaction pressure is above approximately 50 Torr.

11. The method of claim 7 wherein:
    the maintained temperature is above approximately 400° C.

12. The method of claim 7 wherein:
    the substrate has a surface film thereon formed of TiN.

13. A method of nucleating tungsten in a CVD process performed by reduction of WF$_6$ in a vacuum chamber without the use of silane to deposit a metal onto a substrate, the method comprising the steps of:

injecting a gas including hydrogen into the chamber;

injecting a gas including WF$_6$ into the chamber with or following the introduction of hydrogen into the chamber;

elevating the pressure of the gas within the chamber from a subreaction pressure to at least a minimum reaction pressure;

elevating the temperature of the substrate and the gases within the chamber to at least a minimum reaction temperature before WF$_6$ gas within the chamber is raised to the minimum reaction pressure.

14. The method of claim 13 wherein:

the substrate has a surface formed of material selected from the group consisting of CVD TiN, reactively sputtered TiN, or rapid thermal process formed TiN.

15. The method of claim 13 wherein:
the reaction pressure is above approximately 50 Torr.

16. The method of claim 13 wherein:
the reaction temperature is above approximately 400° C.

17. The method of claim 13 wherein:
$WF_6$ gas within the reaction chamber, prior to the elevation of the substrate temperature to the reaction temperature, is maintained at a pressure of not more than approximately 1 Torr.

18. The method of claim 13 wherein:
from prior to introduction of the $H_2$ and $WF_6$ gases until after completion of a tungsten deposition process on the wafer, the wafer is rotated about its center at a speed sufficient to thin a boundary layer across the wafer and to facilitate the transfer of mass between the gases and the wafer.

19. The method of claim 13 further comprising the preliminary steps of:
depositing a TiN film on the wafer in a first vacuum processing chamber of a wafer processing apparatus;
transferring the wafer having the TiN film thereon to a second vacuum processing chamber of a wafer processing apparatus; and
performing the gas injecting steps, pressure elevating step and temperature elevating step on the wafer in the second vacuum processing chamber.

20. The method of claim 19 wherein:
the first and second chambers are connected in the same wafer processing apparatus having a wafer transfer path therebetween containing inert gas maintained at a vacuum pressure level;
the step of transferring the wafer is performed with the wafer maintained in the inert gas at the vacuum pressure level while from the first to the second chamber without exposure of the wafer to an external environment.

* * * * *